(12) United States Patent
Kuo et al.

(10) Patent No.: US 10,199,273 B2
(45) Date of Patent: Feb. 5, 2019

(54) METHOD FOR FORMING SEMICONDUCTOR DEVICE WITH THROUGH SILICON VIA

(71) Applicant: UNITED MICROELECTRONICS CORP., Hsin-Chu (TW)

(72) Inventors: Chien-Li Kuo, Hsinchu (TW); Yung-Chang Lin, Taichung (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 14/997,594

(22) Filed: Jan. 18, 2016

(65) Prior Publication Data

US 2016/0133518 A1   May 12, 2016

Related U.S. Application Data

(62) Division of application No. 13/526,533, filed on Jun. 19, 2012, now Pat. No. 9,275,933.

(51) Int. Cl.
*H01L 21/768* (2006.01)
*H01L 21/8234* (2006.01)
*H01L 23/48* (2006.01)
*H01L 29/06* (2006.01)

(52) U.S. Cl.
CPC .. *H01L 21/76898* (2013.01); *H01L 21/76802* (2013.01); *H01L 21/76843* (2013.01); *H01L 21/76877* (2013.01); *H01L 21/823475* (2013.01); *H01L 23/481* (2013.01); *H01L 29/0649* (2013.01); *H01L 2924/0002* (2013.01)

(58) Field of Classification Search
CPC ......... H01L 21/76898; H01L 21/76801; H01L 21/76843; H01L 21/76877; H01L 21/823475; H01L 23/481; H01L 29/0649; H01L 21/76802; H01L 2924/0002
USPC ................................ 438/424, 637, 640, 643
See application file for complete search history.

(56) References Cited

U.S. PATENT DOCUMENTS

| | | |
|---|---|---|
| 3,150,299 A | 9/1964 | Noyce |
| 3,256,465 A | 6/1966 | Weissenstem |
| 3,323,198 A | 6/1967 | Shortes |
| 3,343,256 A | 9/1967 | Smith |
| 3,372,070 A | 3/1968 | Zuk |
| 3,462,650 A | 8/1969 | Hennings |
| 3,577,005 A | 5/1971 | Christensen |
| 3,648,131 A | 3/1972 | Stuby |
| 4,394,712 A | 7/1983 | Anthony |
| 4,395,302 A | 7/1983 | Courduvelis |
| 4,616,247 A | 10/1986 | Chang |
| 4,773,972 A | 9/1988 | Mikkor |

(Continued)

FOREIGN PATENT DOCUMENTS

CN   101882598 A   11/2010
TW   201023323 A1   6/2010

*Primary Examiner* — Matthew Reames
*Assistant Examiner* — Scott Bauman
(74) *Attorney, Agent, or Firm* — Winston Hsu

(57) ABSTRACT

A semiconductor device includes a substrate; an inter layer dielectric disposed on the substrate; a TSV penetrating the substrate and the ILD. In addition, a plurality of shallow trench isolations (STI) is disposed in the substrate, and a shield ring is disposed in the ILD surrounding the TSV on the STI. During the process of forming the TSV, the contact ring can protect adjacent components from metal contamination.

6 Claims, 5 Drawing Sheets

(56) References Cited

U.S. PATENT DOCUMENTS

| | | |
|---|---|---|
| 4,939,568 A | 7/1990 | Kato |
| 5,214,000 A | 5/1993 | Chazan |
| 5,229,647 A | 7/1993 | Gnadinger |
| 5,286,926 A | 2/1994 | Kimura |
| 5,372,969 A | 12/1994 | Moslehi |
| 5,399,898 A | 3/1995 | Rostoker |
| 5,463,246 A | 10/1995 | Matsunami |
| 5,484,073 A | 1/1996 | Erickson |
| 5,502,333 A | 3/1996 | Bertin |
| 5,627,106 A | 5/1997 | Hsu |
| 5,793,115 A | 8/1998 | Zavracky |
| 5,977,640 A | 11/1999 | Bertin |
| 6,018,196 A | 1/2000 | Noddin |
| 6,143,616 A | 11/2000 | Geusic |
| 6,274,937 B1 | 8/2001 | Ahn |
| 6,309,956 B1 | 10/2001 | Chiang |
| 6,391,777 B1 | 5/2002 | Chen |
| 6,407,002 B1 | 6/2002 | Lin |
| 6,440,640 B1 | 8/2002 | Yang |
| 6,483,147 B1 | 11/2002 | Lin |
| 6,525,419 B1 | 2/2003 | Deeter |
| 6,548,891 B2 | 4/2003 | Mashino |
| 6,551,857 B2 | 4/2003 | Leedy |
| 6,617,681 B1 | 9/2003 | Bohr |
| 6,627,985 B2 | 9/2003 | Huppenthal |
| 6,633,083 B2 | 10/2003 | Woo |
| 6,746,936 B1 | 6/2004 | Lee |
| 6,778,275 B2 | 8/2004 | Bowes |
| 6,800,930 B2 | 10/2004 | Jackson |
| 6,812,193 B2 | 11/2004 | Brigham |
| 6,831,013 B2 | 12/2004 | Tsai |
| 6,897,148 B2 | 5/2005 | Halahan |
| 6,924,551 B2 | 8/2005 | Rumer |
| 6,930,048 B1 | 8/2005 | Li |
| 7,034,401 B2 | 4/2006 | Savastiouk |
| 7,052,937 B2 | 5/2006 | Clevenger |
| 7,075,133 B1 | 7/2006 | Padmanabhan |
| 7,098,070 B2 | 8/2006 | Chen |
| 7,111,149 B2 | 9/2006 | Eilert |
| 7,166,913 B2 | 1/2007 | Chinthakindi |
| 7,222,420 B2 | 5/2007 | Moriizumi |
| 7,282,951 B2 | 10/2007 | Huppenthal |
| 7,323,785 B2 | 1/2008 | Uchiyama |
| 7,338,896 B2 | 3/2008 | Vanhaelemeersch |
| 7,402,515 B2 | 7/2008 | Arana |
| 7,432,592 B2 | 10/2008 | Shi |
| 7,531,415 B2 | 5/2009 | Kwok |
| 7,541,677 B2 | 6/2009 | Kawano |
| 7,732,926 B2 | 6/2010 | Uchiyama |
| 7,846,837 B2 | 12/2010 | Kuo |
| 8,264,086 B2 | 9/2012 | Shue |
| 8,338,939 B2 | 12/2012 | Lin |
| 8,390,120 B2 | 3/2013 | Moon |
| 9,257,392 B2 * | 2/2016 | Yang ............... H01L 23/5384 |
| 2001/0038972 A1 | 11/2001 | Lyons |
| 2004/0080041 A1 | 4/2004 | Kimura |
| 2004/0188817 A1 | 9/2004 | Hua |
| 2005/0112997 A1 | 5/2005 | Lin |
| 2005/0136635 A1 | 6/2005 | Savastiouk |
| 2005/0205991 A1 | 9/2005 | Chen |
| 2006/0035146 A1 | 2/2006 | Hayashi |
| 2006/0042834 A1 | 3/2006 | Lee |
| 2007/0117348 A1 | 5/2007 | Ramanathan |
| 2007/0126085 A1 | 6/2007 | Kawano |
| 2007/0190692 A1 | 8/2007 | Erturk |
| 2008/0073747 A1 | 3/2008 | Chao |
| 2008/0108193 A1 | 5/2008 | You |
| 2009/0108464 A1 * | 4/2009 | Uchiyama ......... H01L 21/6835 |
| | | 257/774 |
| 2009/0127667 A1 | 5/2009 | Iwata |
| 2009/0134498 A1 | 5/2009 | Ikeda |
| 2009/0152703 A1 | 6/2009 | Pratt |
| 2009/0180257 A1 | 7/2009 | Park |
| 2009/0224405 A1 | 9/2009 | Chiou |
| 2010/0001379 A1 | 1/2010 | Lee |
| 2010/0102454 A1 * | 4/2010 | Akiyama ......... H01L 21/76898 |
| | | 257/774 |
| 2010/0130008 A1 * | 5/2010 | Smith ............. H01L 21/76898 |
| | | 438/667 |
| 2010/0140749 A1 | 6/2010 | Kuo |
| 2010/0140772 A1 | 6/2010 | Lin |
| 2010/0224965 A1 | 9/2010 | Kuo |
| 2010/0244247 A1 | 9/2010 | Chang |
| 2010/0323478 A1 | 12/2010 | Kuo |
| 2011/0031581 A1 * | 2/2011 | West .................. H01L 23/481 |
| | | 257/508 |
| 2011/0073987 A1 | 3/2011 | Mackh |
| 2012/0007154 A1 * | 1/2012 | Lin ................. H01L 21/76898 |
| | | 257/288 |
| 2012/0007243 A1 * | 1/2012 | Roy ................ H01L 21/76898 |
| | | 257/754 |
| 2012/0098122 A1 * | 4/2012 | Yang ................... B81C 1/0023 |
| | | 257/737 |
| 2012/0139127 A1 | 6/2012 | Beyne |
| 2012/0248581 A1 | 10/2012 | Sugiyama |
| 2012/0261826 A1 | 10/2012 | Kuo |
| 2013/0099312 A1 | 4/2013 | Dao |
| 2013/0313690 A1 | 11/2013 | Miyazaki |
| 2013/0334669 A1 | 12/2013 | Kuo |
| 2013/0334699 A1 | 12/2013 | Kuo |
| 2014/0053604 A1 | 2/2014 | Newton |
| 2014/0054742 A1 | 2/2014 | Katti |

* cited by examiner

METHOD FOR FORMING SEMICONDUCTOR DEVICE WITH THROUGH SILICON VIA

CROSS REFERENCE TO RELATED APPLICATIONS

This application is a divisional application of U.S. patent application Ser. No. 13/526,533 filed Jun. 19, 2012, which is herein incorporated by reference in its entirety.

BACKGROUND OF THE INVENTION

1. Field of the Invention

The present invention relates to a semiconductor device, and more particularly, a semiconductor device comprising a through silicon via (TSV) and a contact ring.

2. Description of the Prior Art

Nowadays micro-processor systems including integrated circuits (IC) are polyvalent devices, and are used in diverse fields such as automatic control electronics, mobile communication devices and personal computers. With the development of technology and the increasingly imaginative applications of electrical products, the IC devices are increasingly smaller, more precise and more diversified.

As known in the art, IC devices are produced from dies that are fabricated through conventional semiconductor manufacturing processes. A process to manufacture a die starts with a wafer: first, different regions are marked on the wafer; then conventional semiconductor manufacture processes, such as deposition, photolithography, etching or planarization are used to form required circuit traces; then each region of the wafer is separated to form a die and packaged to form a chip; finally, the chips are attached onto boards, for example a printed circuit board (PCB), and the chips are electrically coupled to the pins on the PCB. Thus, each of the programs on the chip can be performed.

In order to evaluate the functions and the efficiency of a chip and increase the capacitance density in order to accommodate more IC components in a limited space, many semiconductor packaging are built up by stacking each die and/or chip, for example, Flip-Chip technology, Multi-chip Package (MCP) technology, Package on Package (PoP) technology and Package in Package (PiP) technology. Besides these technologies, a "Through Silicon Via (TSV)" technique has been well developed in recent years. The TSV can improve the interconnections between the dies in the package so as to increase the package efficiency.

The first step to fabricate a TSV is to form a via on a wafer by an etching or a laser process, then fill the via with copper, polycrystalline silicon, tungsten, or other conductive materials; then, the chips are thinned and packaged or bonded to form a 3D package structure. When using the TSV technique, the interconnection route between the chips is shorter. Thus, in comparison to other technologies, the TSV has the advantages of faster speed, less noise and better efficiency, and therefore looks set to become one of the most popular technologies in the future.

However, there are some issues in the integration process of the TSV with others components. For example, during the step of forming the TSV, vias formed through etching or laser processes may directly expose the metal pad, causing metal contamination and influence others components surrounding the TSV.

SUMMARY OF THE INVENTION

According to one embodiment of the present invention, a semiconductor device is provided comprising a substrate; an ILD (inter layer dielectric) disposed on the substrate; a TSV (through silicon via) penetrating the substrate and the ILD; and a contact ring, disposed in the ILD and surrounding the TSV.

According to another embodiment of the present invention, a semiconductor device is provided, comprising a substrate; an ILD (inter layer dielectric) disposed on the substrate; a TSV (through silicon via) penetrating the substrate and the ILD; and a liner disposed in the TSV, wherein the liner is only disposed in the substrate.

The present invention provides a manufacturing method of a semiconductor device, comprising the following steps: first, a substrate with a front surface and a back surface is provided; then, an ILD (inter layer dielectric) is formed on the front surface; afterward, a metal trace is formed on the ILD; an opening is formed on the back surface of the substrate, penetrating the substrate so as to expose the ILD; a liner is formed in the opening; the liner and the ILD are then etched through the opening to form a TSV hole and expose the metal trace; then, a barrier layer is formed in the TSV hole; finally, a conductive layer is formed on the barrier layer.

The present invention provides a semiconductor device with a TSV having a contact ring and a liner surrounding the TSV, the contact ring and the liner can protect components from metal contamination during the process of forming the TSV.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. Referring to the words "up" or "down" that describe the relationship between components in the text, it is well known in the art and should be clearly understood that these words refer to relative positions that can be inverted to obtain a same structure, and these structures should therefore not be precluded from the scope of the claims in the present invention.

Figure 1:
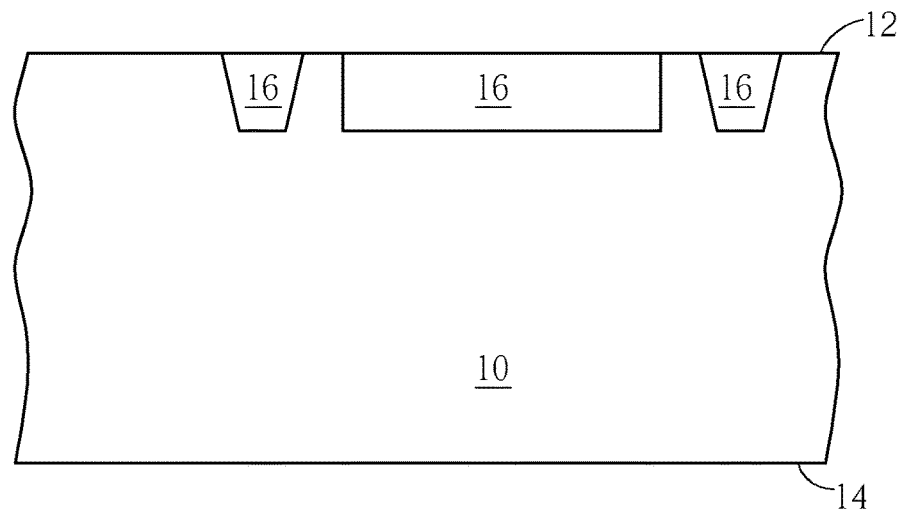
FIGS. 1, 2, 2A, 3, 3A, 4 and 5 are schematic, cross-sectional diagrams illustrating a method for fabricating a semiconductor device in accordance with the first preferred embodiment of the invention.

Please refer to FIGS. 1, 2, 2A, 3, 3A, 4 and 5. FIGS. 1, 2, 2A, 3, 3A, 4 and 5 are schematic, cross-sectional view diagrams showing a method for fabricating a semiconductor device with a TSV according to the first preferred embodiment of the present invention. As shown in FIG1, at first, a substrate 10 is provided, such as silicon substrate, an epitaxial silicon substrate, a silicon germanium substrate, a silicon carbide substrate or a silicon-on-insulator (SOI), wherein the substrate 10 has a front surface 12 and a back surface 14. An N-well or a P-well is then formed in the substrate 10 (not shown), and a plurality of STI (shallow trench isolations) 16 is then formed in the substrate 10.

Figure 2:
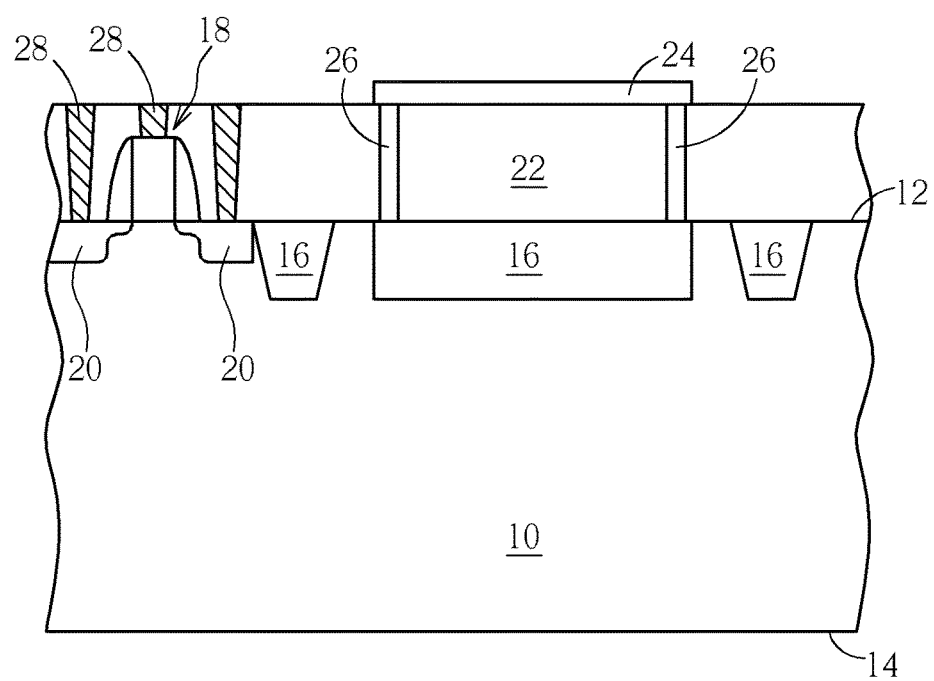

As shown in FIG. 2, at least one gate structure 18 is formed on the substrate 10, and an S/D region 20 is then formed in the substrate 10 wherein the S/D region 20 is located at both sides of the gate structure 18. The gate structure 18 includes a polysilicon gate, a metal gate or a dummy gate, but not limited thereto. The method for fabricating the gate structure 18, the S/D region 20, or a salicide (not shown) layer disposed on the S/D region 20 are well known to persons of ordinary skills in the art and the details will not be described here. An ILD (inter layer dielectric) 22 is deposited on the gate structure 18 and the front surface 12, an inter metal dielectric (IMD) process is then carried out to form a plurality of IMD (inter metal dielectric) (not shown) and a plurality of metal traces which are disposed in each IMD (not shown) on the ILD 22. To simplify the description, FIG. 2 only illustrates a metal trace 24 formed on the ILD 22, which corresponds to a TSV formed in following steps and neglect others IMD and others metal traces disposed in the IMD. A bottom surface of the metal trace 24 can directly contact the TSV; hence the TSV can be electrically connected to other components through the metal traces disposed in the IMD. Besides, a contact etching stop layer (CESL) (not shown) may be selectively formed between the ILD 22 and the substrate 10 to cover the gate structure 18 and the S/D region 20.

It is worth noting that, in the present invention, a via plug process is carried out before the metal trace 24 is formed, in order to form a plurality of contact plugs 28, and a contact ring 26 can be formed in the ILD 22 during the via plug process simultaneously. The contact plugs 28 are disposed on the gate structure 18 and the S/D region 20 is electrically connected to the metal traces (not shown) disposed in the IMD above the ILD 22. Additionally, the contact ring 26 is disposed on the STI 16, is preferably ring-shaped and doesn't contact the TSV, so that the inner diameter of the contact ring 26 is larger than the outer diameter of the TSV, but smaller than the width of the metal trace 24. In addition, the contact ring 26 directly contacts the metal trace 24, so the contact ring 26 is electrically connected to the metal trace 24 to obtain a better shield performance. In the present invention, the materials of the metal trace 24, the contact ring 26 and the contact plug 28 can be selected from the group of copper (Cu), aluminum (Al), tungsten (W), titanium (Ti), titanium nitride (TiN), tantalum (Ta) or tantalum nitride (TaN), but not limited thereto.

Figure 2A:
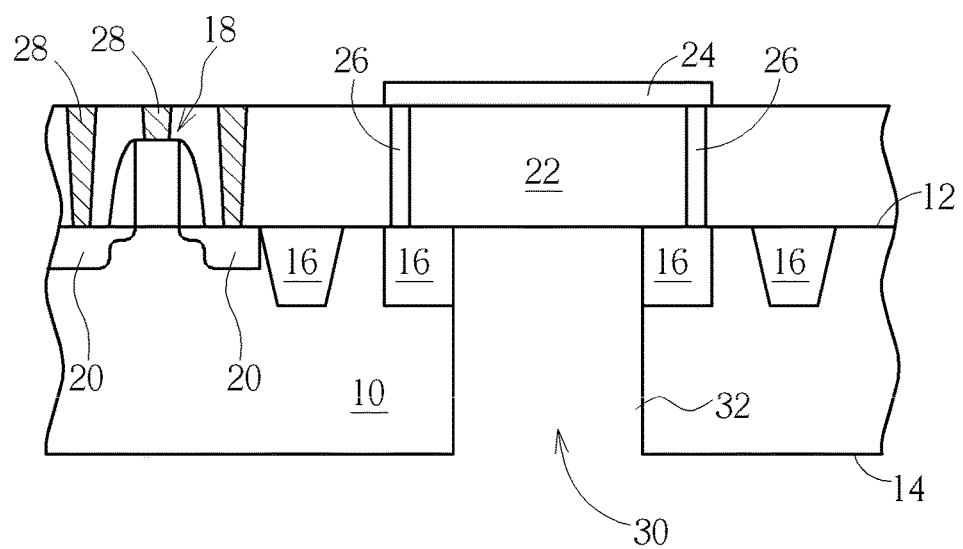
Figure 3:
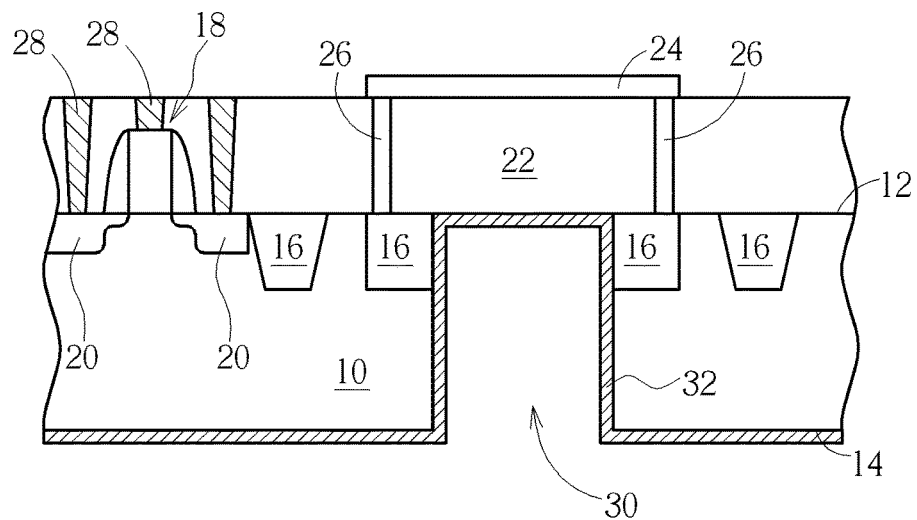

After the IMD process is carried out and a bonding pad disposed on the IMD is formed on the front surface 12, the back surface 14 of the substrate 10 is grinded to thin down the substrate 10. Then, as shown in FIG. 2A, an opening 30 is formed on the back surface 14 through a photo-etching process, wherein the opening 30 is used to define the location of the TSV that is formed in following steps. The opening 30 penetrates the substrate 10 and the STI 16. Besides, a bottom of the opening 30 is stopped on a bottom of the ILD 22. The etching may be carried out through a dry etching process using $CF_4$, $O_2$ and Ar, or a wet etching process, such as dilute HF. In a following step, as shown in FIG. 3, a liner 32 is formed on the back surface 14 and in the opening 30 to cover the bottom surface and the sidewalls of the opening 30, the liner 32 is a single layer structure such as SiN or SiO2, or a multi-layer structure, but not limited thereto. It is worth noting that, since the bottom of the opening 30 is only stopped on the surface of the ILD 22, the liner 32 formed in the opening 30 will therefore not be disposed in the ILD 22, but only disposed in the substrate 10.

Figure 3A:
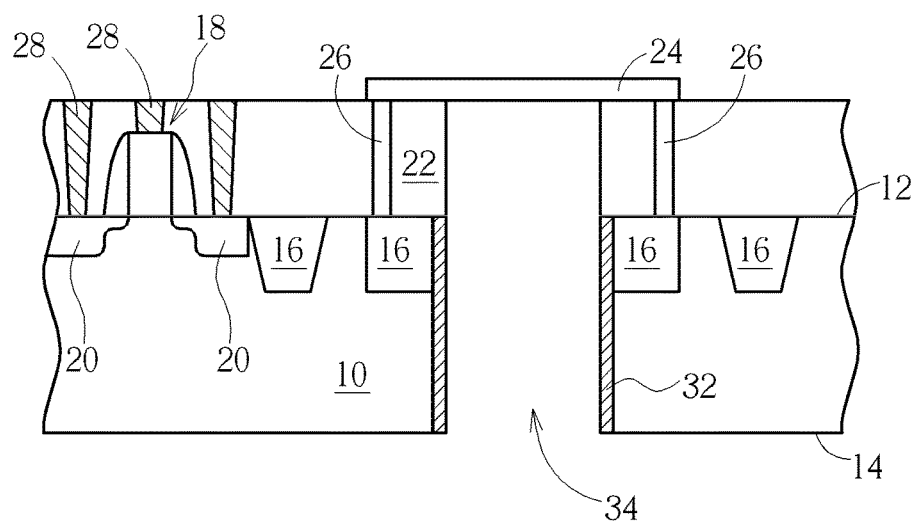
Figure 4:
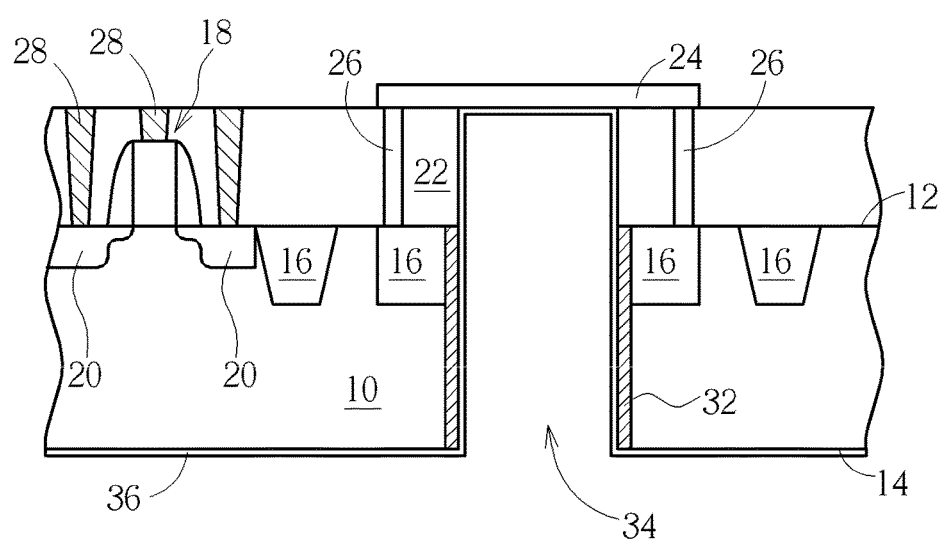

Afterward, an etching process is then performed on the opening 30 again, as shown in FIG. 3A, in order to form a TSV hole 34, and a bottom of the TSV hole 34 is stopped on a bottom of the metal trace 24. The etching process only penetrates the liner 32 and the ILD 22 through the opening 30, so that the etching time is short and easy to control, thereby increasing the uniformity of the etching surface. A barrier layer 36 is then deposited in the TSV hole 34 to cover the bottom and the sidewalls of the TSV hole 34 (as shown in FIG. 4), and the barrier layer 36 is substantially connected to the metal trace 24. The barrier layer 36 includes Ti, TiN, Ta or TaN, but not limited thereto.

Figure 5:
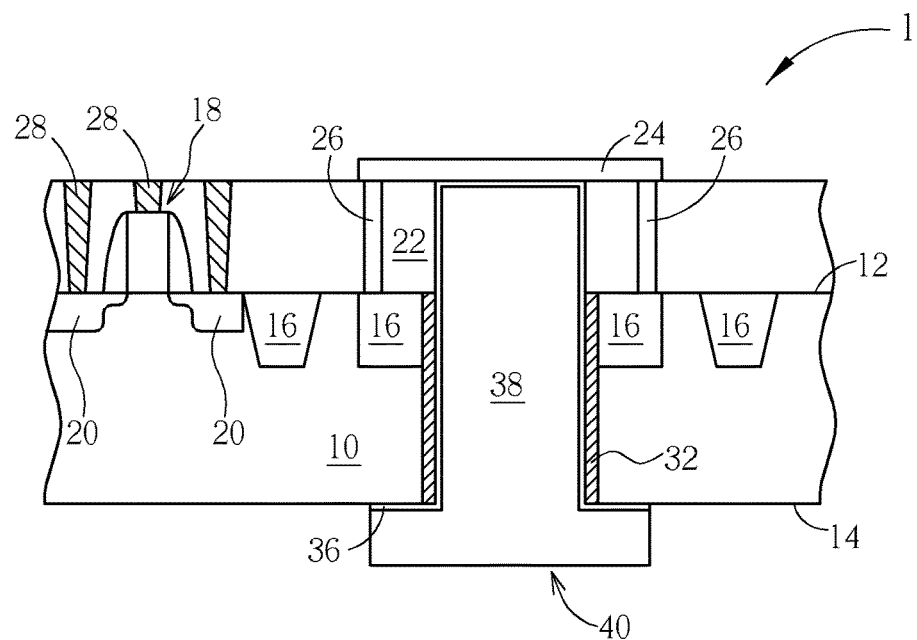

As shown in FIG. 5, a conductive layer 38 is then formed on the barrier layer 36 and fills the TSV hole 34 to form a TSV 40. The conductive layer 38 includes metals with high conductivity, such as Copper (Cu). The manufacturing method to form the conductive layer 38 comprises the following steps: first, a Cu seed layer can be formed on the barrier layer 36, and a backside-bump process is carried out to form a patterned photo resistor (not shown), after electroplating Cu layer on the Cu seed layer, the patterned photo resistor is removed and a semiconductor device with a TSV is completed. This way, a semiconductor device 1 of the present invention includes a substrate 10, a plurality of STI 16 on the substrate 10, an ILD 22 disposed on the substrate 10, a TSV 40 penetrating the substrate 10, the STI 16 and the ILD 22, a contact ring 26 disposed in the ILD 22 and surrounding the TSV 40, and disposed on the STI 16, and a liner 32 disposed only in the substrate 10, surrounding the TSV 40, and not disposed in the ILD 22.

A specific feature of the present invention is to etch the back surface 14 to form the opening 30 wherein the bottom of the opening 30 stops on the surface of the ILD 22, but not directly exposing the metal trace 24, then to form the liner 32 on the bottom and the sidewalls of the opening 30, and penetrate the ILD 22 through a short time etching process so as to form a TSV hole 34 and expose the metal trace 24. Hence, the problem that of the metal trace 24 directly exposed through the opening 30 that causes metal contamination affecting others adjacent components, such as the gate structure 18, can be prevented. In addition, the present invention further overcomes the problem of the metal trace 24 being destroyed through the etching process that directly penetrates the substrate 10, the STI 16 and the ILD 22.

Another specific feature of the present invention is to have the contact ring 26. In the present invention, the contact ring 26 is formed in the ILD 22 and surrounds the TSV 40 before the metal trace 24 is formed. Therefore, when the opening 30 is penetrated through the etching process to expose the metal trace 24, the contact ring can protect adjacent components from metal contamination. Besides, the TSV 40 usually connects others semiconductor components, such as transistors, memories, inductors or resistors. When the TSV 40 acts as a power pin, the massive current transmitted through the TSV 40 will cause serious electromagnetic interference (EMI) to the adjacent components, such as the gate structure 18. The contact ring 26 can solve this problem. The contact ring 26 is disposed on the periphery of the TSV 40. As a result, the EMI produced by the massive current conducting through the TSV 40 can be prevented by the contact ring 26. The material of the contact ring 26 can be selected from a group consisting of copper (Cu), aluminum (Al), tungsten (W), titanium (Ti), titanium nitride (TiN), tantalum (Ta) or tantalum nitride (TaN). However, the material of the contact ring 26 depends on the integration of the semiconductor manufacture process and is not limited to the above.

The following description will detail different embodiments of the semiconductor device with TSV and the manufacturing method of the present invention. To simplify the description, the following descriptions will detail the dissimilarities among the different embodiments and the identical features will not be redundantly described. In order to easily compare the differences between the embodiments, the identical components in each of the following embodiments are marked with identical symbols.

Figure 6:
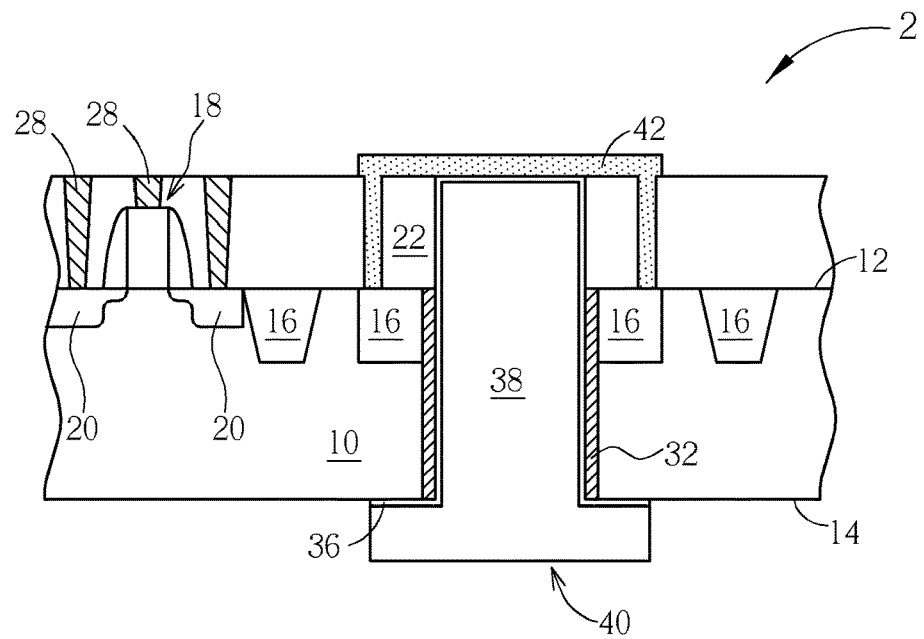
FIG. 6 is a schematic, cross-sectional diagram showing a semiconductor device in accordance with the second preferred embodiment of the invention.

Please refer to FIG. 6, FIG. 6 is a schematic, cross-sectional diagram showing a semiconductor device in accordance with the second preferred embodiment of the invention. Similarly to the first preferred embodiment of the present invention, a semiconductor device 2 includes a substrate 10, a plurality of STI 16 disposed in the substrate 10, an ILD 22 disposed on the substrate 10, a TSV 40 penetrating the substrate 10 and the ILD 22, and a liner 32 which is only disposed in the substrate 10 and surrounds the TSV 40. The difference with the first preferred embodiment is that the contact ring 42 and the metal trace are formed at the same time, in other words, the contact ring 42 is a monolithic structure together with the metal trace. In the first preferred embodiment, the metal trace is formed after the contact ring is formed, but in this embodiment, the contact ring 42 and the metal trace are formed simultaneously. Besides, each of the contact plugs 28 and the contact ring 42 can be formed simultaneously too, or formed in different steps. If the contact plugs 28 and the contact ring 42 are formed together, the manufacturing process can be further simplified. In addition, the contact ring 42 and the contact plug 28 includes metal with high conductivity such as copper (Cu), aluminum (Al), tungsten (W), titanium (Ti), titanium nitride (TiN), tantalum (Ta) or tantalum nitride (TaN), but not limited thereto. Apart from the contact ring 42, the other components, material properties, and manufacturing method of the semiconductor device 2 are similar to those of the first preferred embodiment detailed above and will not be redundantly described In order to increase the contact ringing effect, the contact ring 26 structure in the present invention is further coupled with a ground connection or a floating connection (not shown). The ground connection may be connected to a stable grounding device, such as a system plate installed with a semiconductor package (not shown), or a chip-scale ground connection, in order to control the noise more efficiently. Furthermore, a high-frequency wave filter may be used between the system plate and the contact ring 26 to selectively remove the high-frequency noise.

In addition, the present invention is not only applied in via-last process, it also may be obtained through using a via-middle process or a via-first process. Each process can be substantially integrated into existing semiconductor manufacture processes.

To summarize the above descriptions, the present invention provides a semiconductor device with a TSV having a contact ring and a liner surrounding the TSV. The liner and the contact ring can protect the components adjacent to the TSV from metal contamination during the process of forming the TSV.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
    providing a substrate, with a front surface and a back surface, and a STI (Shallow Trench Isolation) disposed therein;
    forming an ILD (inter layer dielectric) on the front surface ;
    forming a contact ring in the ILD;
    forming a metal trace on the ILD;
    forming an opening on the back surface of the substrate penetrating the substrate so as to expose the ILD;
    forming a liner in the opening, wherein the STI contacts parts of the liner directly;
    etching the liner and the ILD through the opening to form a TSV hole and expose the metal trace, wherein the TSV hole penetrates the STI, and wherein the TSV hole is disposed beside the contact ring, and
    wherein the contact ring does not contact the TSV hole directly;
    forming a barrier layer in the TSV hole; and
    forming a conductive layer on the barrier layer.

2. The manufacturing method of a semiconductor device of claim 1, wherein the contact ring is disposed on the STI.

3. The manufacturing method of a semiconductor device of claim 1, wherein the contact ring is electrically connected to the metal trace.

4. The manufacturing method of a semiconductor device of claim 1, further comprising forming a plurality of contacts in the ILD, and the contact ring is formed at the same time.

5. The manufacturing method of a semiconductor device of claim 1, further comprising forming a plurality of contacts in the ILD, and the contact ring is formed at different times.

6. The manufacturing method of a semiconductor device of claim 1, further comprising at least one gate structure and the gate structure includes a metal gate, a polysilicon gate or a dummy gate.

* * * * *